(12) United States Patent
Chung et al.

(10) Patent No.: US 7,395,176 B2
(45) Date of Patent: Jul. 1, 2008

(54) MEMORY CONTROLLER FOR CONTROLLING A REFRESH CYCLE OF A MEMORY AND A METHOD THEREOF

(75) Inventors: Young-Jin Chung, Seongnam-si (KR); Byeong-Whee Yun, Yongin-si (KR); Jin-Aeon Lee, Suwon-si (KR); Min-Su Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/878,870

(22) Filed: Jun. 28, 2004

(65) Prior Publication Data

US 2005/0007864 A1    Jan. 13, 2005

(30) Foreign Application Priority Data

Jul. 12, 2003    (KR) ...................... 10-2003-0047542

(51) Int. Cl.
  *G01K 1/08*    (2006.01)
(52) U.S. Cl. ...................................................... 702/132
(58) Field of Classification Search ................. 702/132; 365/211, 222, 111, 221; 714/9; 356/211, 356/222, 221, 111
See application file for complete search history.

(56) References Cited

U.S. PATENT DOCUMENTS

| | | | | |
|---|---|---|---|---|
| 5,495,452 | A * | 2/1996 | Cha | ............................ 365/222 |
| 6,263,452 | B1 * | 7/2001 | Jewett et al. | .................... 714/9 |
| 6,459,650 | B1 | 10/2002 | Lin | |
| 2001/0014049 | A1 * | 8/2001 | Woo et al. | .................... 365/211 |
| 2002/0018389 | A1 * | 2/2002 | Ito et al. | ...................... 365/222 |
| 2003/0067830 | A1 * | 4/2003 | Leung et al. | ................ 365/222 |

FOREIGN PATENT DOCUMENTS

| | | |
|---|---|---|
| DE | 195 02 557 A1 | 10/1995 |
| DE | 100 42 383 A1 | 3/2002 |

\* cited by examiner

*Primary Examiner*—Tung S. Lau
*Assistant Examiner*—Xiuquin Sun
(74) *Attorney, Agent, or Firm*—F. Chau & Assoc., LLC

(57) ABSTRACT

Provided are a memory controller for controlling a refresh cycle of a memory and a method thereof. In this method, a temperature measure command is generated to measure an operating temperature of the memory. Next, a measured temperature in response to the temperature measure command is received. Then, a temperature difference between the measured temperature and a reference temperature is detected if the measured temperature is different from the reference temperature to change the refresh cycle according to the temperature difference, and if the measured temperature is equal to the reference temperature the method returns to the temperature measure command generating step. Thereafter, a refresh command is applied to the memory in response to the changed refresh cycle.

12 Claims, 4 Drawing Sheets

MEMORY CONTROLLER FOR CONTROLLING A REFRESH CYCLE OF A MEMORY AND A METHOD THEREOF

CROSS-REFERENCE TO RELATED APPLICATION

This application claims priority to Korean Patent Application No. 2003-47542, filed on Jul. 12, 2003, in the Korean Intellectual Property Office, the disclosure of which is incorporated herein in its entirety by reference.

BACKGROUND OF THE INVENTION

1. Technical Field

The present invention relates to a memory controller, and more particularly, to a memory controller for controlling a refresh cycle of an external memory and a method thereof.

2. Discussion of the Related Art

In general, data is stored as charges in capacitors located in dynamic random access memory (DRAM) cells. Because the capacitors on which the charges are stored are not perfect, their stored charges leak over time. Thus, a process for reading out data from the DRAM cells and rewriting the data back to the DRAM cells needs to be repeated before the data stored in the capacitors is lost. This process is called a refresh operation.

In principle, computers cannot use DRAMs during the refresh operation. For example, the time required to perform one refresh operation is equal to a cycle time of a common write operation, thus after the time for performing the refresh operation has passed, external computers cannot use the DRAMs. The time during which the DRAMs cannot be used due to the refresh operation is called a busy rate. As such, computers are typically designed to have a busy rate as short as possible. When computer systems are in a sleep mode, most of the systems' internal devices are turned off, while the DRAMs therein are refreshed to maintain their data. Accordingly, a self refresh current flows through the DRAMs. Thus, it is important for battery-operated computer systems to reduce their self refresh current.

A recent trend in the development of computer systems is to change a refresh cycle according to temperature variations and thus reduce the refresh current. For example, a frequency of a refresh clock is lowered by dividing temperatures into several levels from low to high and then using a low temperature to reduce the current consumption of a computer system. This development trend is based on the fact that DRAMs retain data for a longer time when they are subject to lower temperatures.

In system-on-a-chip (SOC) products and/or system-in-a-package (SIP) technology, which involve stacking memory chips, e.g., negative AND (NAND) flash memory chips, synchronous dynamic random access memory (SDRAM) chips, or double data rate (DDR) SDRAM chips in a single package, the heat generated by processors used, for example, in the SOC or SIP products is directly transferred to the memory chips disposed above the processors.

When using the SOC or SIP products, the heat generated during a refresh operation causes DRAMs, which are adversely affected by excess heat, to deteriorate. Thus, a time during which the DRAMs can retain data is reduced due to the heat generated by the processors or circumferential environments. One method used to prevent the deterioration of DRAMs due to excess heat is to assume the worst-case temperature conditions during the design process of the DRAMs, and thus, shorten the auto refresh cycle for the DRAMs.

In addition, as hand-held devices require high-performance and various multi-media functions as well as high speed data communication capabilities, the performance of their DRAMs is also important. Therefore, the SOC or SIP products must also deal with performance degradation resulting from an auto refresh command cycle that has been shortened to compensate for the worst-case temperature conditions.

The above method of shortening the auto refresh cycle is typically the only way to retain the data of the DRAMs when temperatures are at their highest levels, namely, when refresh operations of the DRAMs are in the worst case. However, because the auto refresh cycle of the DRAMs is determined under the worst case, the performance of the DRAMs in the SOC or SIP products deteriorates except when the temperatures are at their highest levels.

SUMMARY OF THE INVENTION

A first aspect of the present invention provides a memory controller for controlling a refresh cycle of a memory according to temperature variations. A second aspect of the present invention provides a method of controlling a refresh cycle of a memory according to temperature variations. A third aspect of the present invention provides a system-on-a-chip (SOC) having a memory controller for controlling a refresh cycle of a memory according to temperature variations.

According to the first aspect of the present invention, there is provided a method of controlling a refresh cycle of a memory disposed outside a system-on-a-chip comprising a memory controller. The method comprises: generating a temperature measure command to measure an operating temperature of the memory; receiving a measured temperature in response to the temperature measure command; detecting a temperature difference if the measured temperature is different from a reference temperature to change the refresh cycle according to the temperature difference, and returning to the temperature measure command generating step if the measured temperature is equal to the reference temperature; and applying a refresh command to the memory in response to the changed refresh cycle.

The temperature difference detecting step comprises: determining whether the memory controller is in an operating condition suitable to generate the refresh command; and generating the changed refresh cycle if it is determined that the memory controller is in the operating condition suitable to generate the refresh command. The temperature measure command is generated at predetermined intervals, wherein the predetermined intervals are set by a user. The temperature measure command is applied to the memory when the memory is in a stand-by mode. The changed refresh cycle is increased if the measured temperature is lower than the reference temperature, and the changed refresh cycle is decreased if the measured temperature is higher than the reference temperature. The reference temperature is changed in response to the changed refresh cycle.

According to the second aspect of the present invention, there is provided a memory controller comprising a temperature measure command generating portion, a control portion, and a refresh command generating portion. The temperature measure command generating portion generates a temperature measure command in response to a signal to measure an operating temperature of an external memory. The control portion receives a measured temperature and a reference temperature information signal that comprises a reference temperature, and detects a temperature difference between the measured temperature and the reference temperature if the measured temperature is different from the reference temperature to generate a refresh cycle control signal for changing a refresh cycle according to the temperature difference. The refresh command generating portion applies a refresh command to the external memory in response to the refresh cycle control signal.

The memory controller further comprises an operating condition determining portion for receiving the refresh cycle control signal and determining whether a current operating condition is suitable to generate the refresh command, and applying the refresh cycle control signal to the refresh command generating portion if it is determined that the current operating condition is suitable to generate the refresh command.

The current operating condition suitable to generate the refresh command is a state where operations for controlling the external memory except a refresh control are halted. The memory controller further comprises a timer for generating the signal when a value for generating the signal is counted, wherein the value is controlled by a user.

The temperature measure command is applied to the external memory when the external memory is in a stand-by mode. The control portion generates the refresh cycle control signal to increase the refresh cycle if the measured temperature is lower than the reference temperature, and generates the refresh cycle control signal to decrease the refresh cycle if the measured temperature is higher than the reference temperature. The reference temperature information signal is changed in response to the refresh cycle control signal. The reference temperature is set by a user.

According to the third aspect of the present invention, there is provided an SOC comprising a temperature measure command generating portion, a control portion, a refresh command generating portion, an operating condition determining portion, and a timer. The temperature measure command generating portion generates a temperature measure command in response to a signal to measure an operating temperature of an external memory. The control portion receives a measured temperature and a reference temperature information signal that comprises a reference temperature, and detects a temperature difference if the measured temperature is different from the reference temperature to generate a refresh cycle control signal for changing a refresh cycle according to the temperature difference.

The refresh command generating portion applies a refresh command to the external memory in response to the refresh cycle control signal. The operating condition determining portion receives the refresh cycle control signal to determine whether a current operating condition is suitable to generate the refresh command, and applies the refresh cycle control signal to the refresh command generating portion if it is determined that the current operating condition is suitable to generate the refresh command. The timer generates the signal when a value for generating the signal is counted.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

Figure 1:
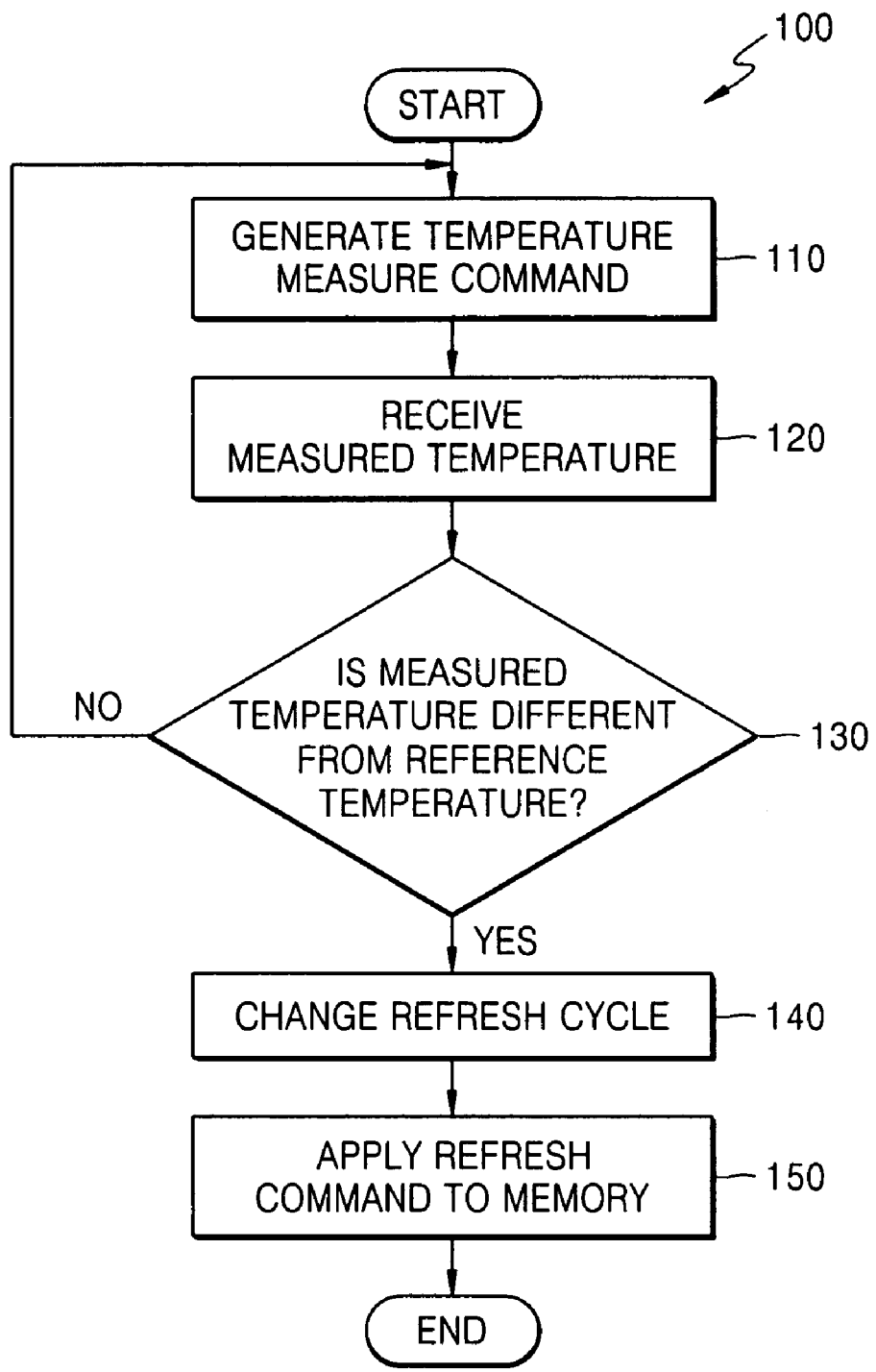
FIG. 1 is a flowchart illustrating a method of controlling a refresh cycle according to an exemplary embodiment of the present invention.

FIG. 1 is a flowchart illustrating a method of controlling a refresh cycle according to an exemplary embodiment of the present invention.

Referring to FIG. 1, a method 100 of controlling a refresh cycle of an external memory disposed outside a system-on-a-chip (SOC) having a memory controller is performed by the following steps. In step 110, a temperature measure command is generated at predetermined intervals to measure an operating temperature of the memory. In step 120, a temperature measured in response to the temperature measure command is received. In step 130, it is determined whether the measured temperature is different from a reference temperature. If it is determined that the measured temperature is different from the reference temperature in step 130, the process continues with step 140. In step 140, a temperature difference between the measured temperature and the reference temperature is detected and the refresh cycle is changed according to the temperature difference. If it is determined that the measured temperature is equal to the reference temperature in step 130, the process returns to step 110. In step 150, a refresh command is applied to the memory in response to the changed refresh cycle.

Figure 3:
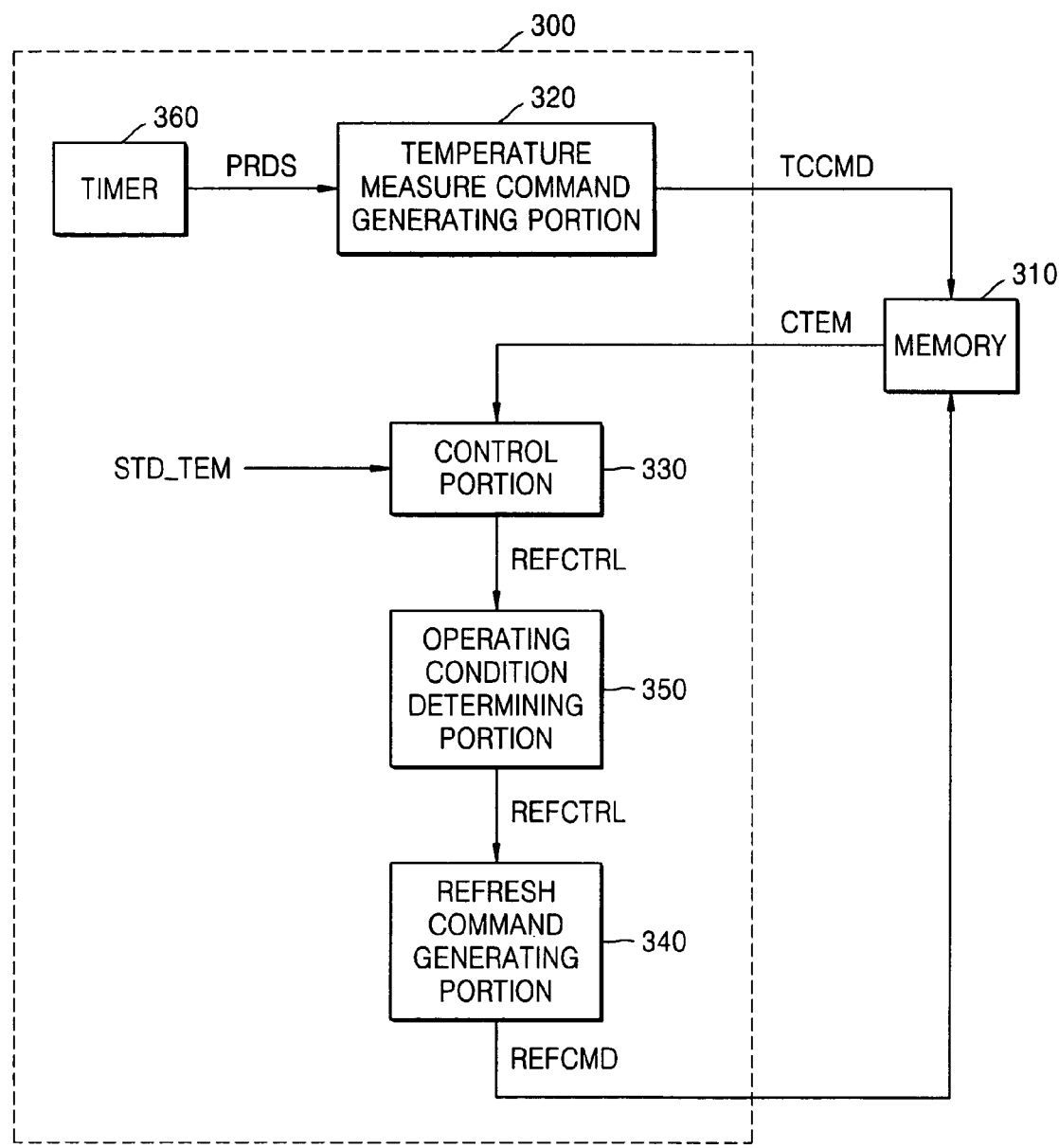
FIG. 3 is a block diagram of a memory controller according to an exemplary embodiment of the present invention.

FIG. 3 is a block diagram of a memory controller according to an exemplary embodiment of the present invention.

A memory controller 300 includes a temperature measure command generating portion 320, a control portion 330, a refresh command generating portion 340, an operating condition determining portion 350, and a timer 360. The method 100 of controlling the refresh cycle and the operation of the memory controller 300 will now be explained with reference to FIGS. 1 and 3.

In step 110, the temperature measure command is generated at predetermined intervals to measure the operating temperature of the memory. Step 110 is performed by the temperature measure command generating portion 320. That is, the temperature measure command generating portion 320 generates a temperature measure command TCCMD in response to a predetermined periodic signal PRDS to measure an operating temperature of an external memory 310.

The temperature measure command TCCMD is applied to the external memory 310 at predetermined intervals set by a user to periodically check the temperature of the external memory 310. An auto refresh cycle is set under the worst conditions during initialization, and is then set in response to a signal relating to the temperature generated by the external memory 310. The auto refresh cycle is longer during the initialization than after the initialization so that it can retain data of the external memory 310 even under the worst conditions. Here, the cycle of checking the temperature of the external memory 310 can be set by the user and stored in a register (not shown) inside the memory controller 300.

That is, the temperature measure command TCCMD can be generated at the predetermined intervals set by the user. To achieve this, the memory controller 300 uses the timer 360 to generate the periodic signal PRDS when a predetermined value, which can be controlled by the user, is counted. Once the user sets the value, the timer 360 generates the periodic signal PRDS when the set value is counted.

If the memory controller 300 generates the temperature measure command TCCMD, the memory controller 300 cannot send commands, such as a data write, data read, precharge, refresh, and mode register set (MRS), to the external memory 310. That is, the temperature measure command TCCMD is applied to the external memory 310 when the external memory 310 is in a stand-by mode.

In step 120, the temperature measured in response to the temperature measure command TCCMD is received. In step 130, it is determined whether the measured temperature is different from the reference temperature. If it is determined that the measured temperature is different from the reference temperature in step 130, the process continues with step 140. In step 140, a temperature difference between the measured temperature and the reference temperature is detected and the refresh cycle is changed according to the temperature difference. If it is determined that the measured temperature is equal to the reference temperature in step 130, the process returns to step 110.

Steps 120-140 are performed by the control portion 330 of the memory controller 300. That is, the control portion 330 receives a reference temperature information signal STD_TEM containing information regarding a reference temperature and a measured temperature CTEM, and detects a temperature difference between the reference temperature and the measured temperature CTEM if the measured temperature CTEM is different from the reference temperature to generate a refresh cycle control signal REFCTRL for changing the refresh cycle according to the temperature difference. In step 120, the measured temperature CTEM is received from the external memory 310. The memory controller 300 recognizes a current temperature of the external memory 310 based on the measured temperature CTEM, and thus, can change the auto refresh cycle of the external memory 310 based on the current temperature.

If the measured temperature CTEM is equal to the reference temperature contained in the reference temperature information signal STD_TEM, the control portion 330 causes the memory controller 300 to go into a stand-by mode until the value of the timer 360 is counted. The reference temperature can be set by the user. If the value of the timer 360 is counted and the periodic signal PRDS is generated, the temperature measure command TCCMD is applied to the external memory 310 again, and the control portion 330 receives a newly measured temperature CTEM to compare the measured temperature CTEM with the reference temperature.

If the measured temperature CTEM is different from the reference temperature, a temperature difference between the measured temperature CTEM and the reference temperature is detected and the refresh cycle control signal REFCTRL is generated to change the refresh cycle according to the temperature difference.

The control portion 330 then generates the refresh cycle control signal REFCTRL to increase the refresh cycle if the measured temperature CTEM is lower than the reference temperature, and generates the refresh cycle control signal REFCTRL to decrease the refresh cycle if the measured temperature CTEM is higher than the reference temperature. A value of a refresh timer (not shown) that is to be counted can also be changed, for example, to change the refresh cycle.

The reference temperature information signal STD_TEM is changed in response to the refresh cycle control signal REFCTRL. That is, the refresh cycle control signal REFCTRL controls the reference temperature information signal STD_TEM that includes information regarding a changed reference temperature that corresponds to the measured temperature CTEM of the external memory 310. Therefore, the measured temperature CTEM of the external memory 310 is compared with a new reference temperature.

In step 150, the refresh command is applied to the external memory 310 in response to the changed refresh cycle. Step 150 is performed by the refresh command generating portion 340. The refresh command generating portion 340 applies the refresh command REFCMD to the external memory 310 in response to the refresh cycle control signal REFCTRL. That is, the memory controller 300 recognizes the current operating condition of the external memory 310 and refreshes, for example, a DRAM cell of the external memory 310 in a cycle suitable for the temperature, thus resulting in improved performance of the external memory 310.

Figure 2:
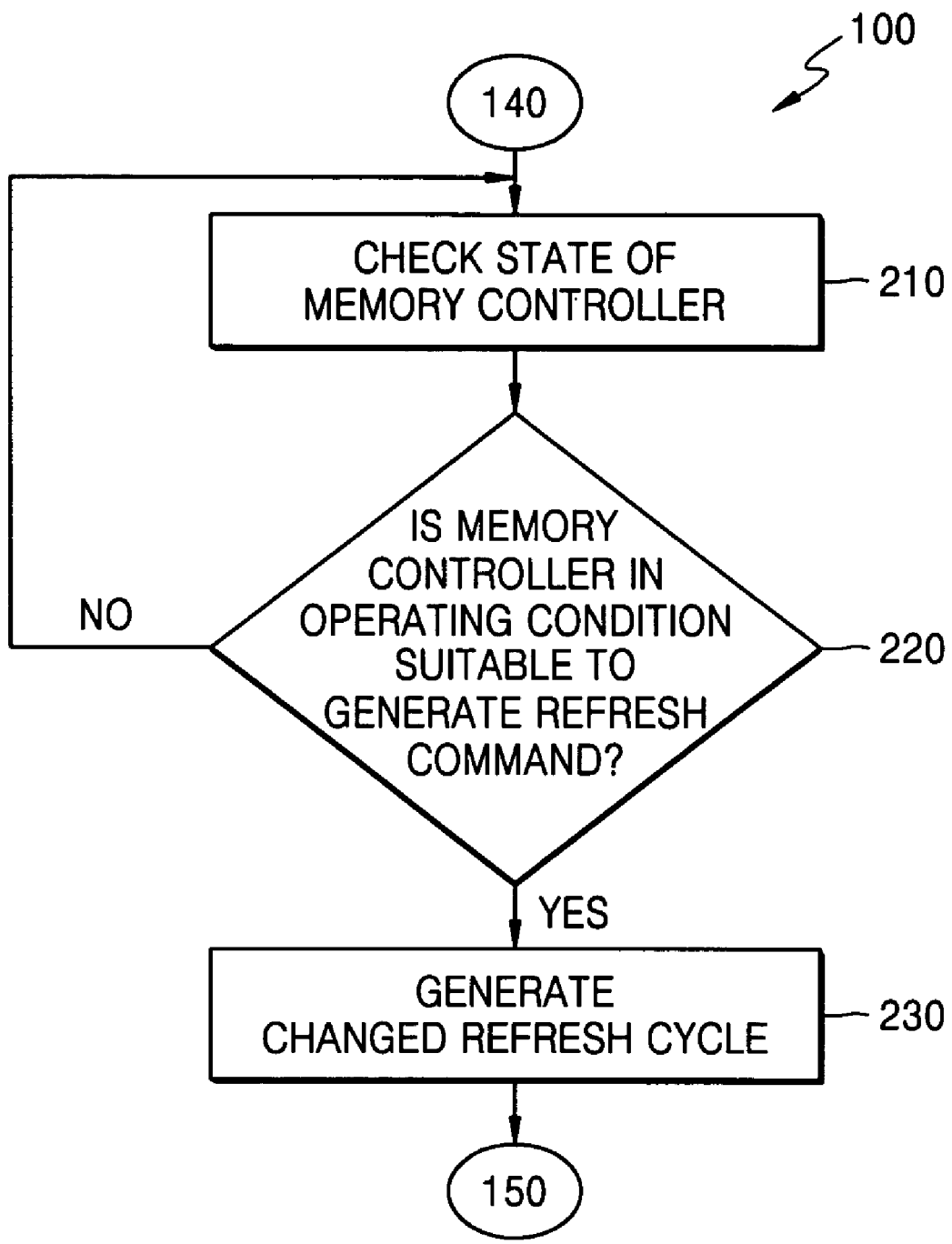
FIG. 2 is a flowchart illustrating operations performed between steps 140 and 150 of FIG. 1.

FIG. 2 is a flowchart illustrating operations performed between steps 140 and 150 of FIG. 1.

Referring to FIG. 2, the method 100 of controlling the refresh cycle further includes, between steps 140 and 150, checking a state of the memory controller 300 in step 210, determining whether the memory controller 300 is in an operating condition suitable to generate the refresh command in step 220, and generating the changed refresh cycle in step 230 if it is determined that the memory controller 300 is in the operating condition suitable to generate the refresh command in step 220.

Steps 210-230 are performed by the operating condition determining portion 350. The operating condition determining portion 350 receives the refresh cycle control signal REFCTRL and determines whether the memory controller 300 is in a current operating condition suitable to generate the refresh command REFCMD. If it is determined that the memory controller 300 is in the operating condition suitable to generate the refresh command REFCMD, the operating condition determining portion 350 applies the refresh control signal REFCTRL to the refresh command generating portion 340.

In some instances, the memory controller 300 cannot readily change the refresh cycle in response to the refresh cycle control signal REFCTRL. To remedy this, the refresh cycle control signal REFCTRL is stored and the operating condition of the memory controller 300 is recognized. That is, for the memory controller 300 to generate the refresh command REFCMD, the memory controller 300 should be in a state where it does not perform any operations for controlling the external memory 310 except a refresh control.

Therefore, if the memory controller 300 does not perform any operations for controlling the external memory 310, the operating condition determining portion 350 applies the refresh cycle control signal REFCTRL to the refresh command generating portion 340. If the memory controller 300 performs an operation for controlling the external memory 310, the operating condition determining portion 350 stores the refresh cycle control signal REFCTRL, and after the operation for controlling the external memory 310 is finished, the operating condition determining portion 350 applies the refresh cycle control signal REFCTRL to the refresh command generating portion 340.

Through the above operations, the memory controller 300 can detect the operating temperature of the external memory 310 at the predetermined intervals set by the user and set a refresh cycle that is suitable for the current operating condition of the external memory 310 to retain data within the external memory 310. Furthermore, because the memory controller 300 and the refresh cycle control method 100 ensure better performance than when the refresh cycle is determined under the worst cases, they can minimize performance degradation of the external memory 310 due to temperature variations when applied to system-in-a-package (SIP) products or SOC products.

Figure 4:
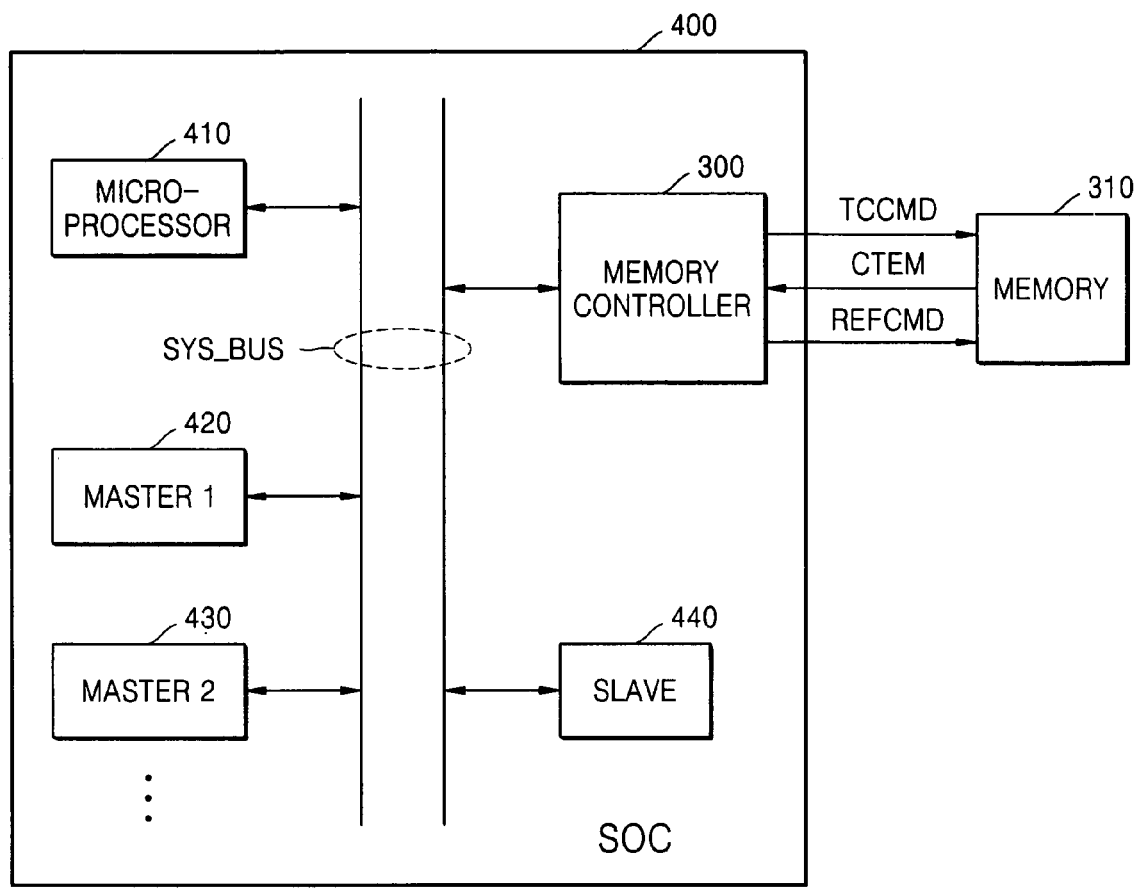
FIG. 4 is a block diagram of a system-on-a-chip (SOC) according to an exemplary embodiment of the present invention.

Referring to FIGS. 3 and 4, a semiconductor system includes a SOC 400 and the external memory 310. The SOC 400 comprises the memory controller 300, which includes the temperature measure command generating portion 320, the control portion 330, the refresh command generating portion 340, the operating condition determining portion 350, and the timer 360.

The SOC 400 also includes a micro processor 410, masters 420 and 430, which may be digital signal processors DSPs, the memory controller 300, and a slave 440 connected to each other via a common bus SYS_BUS. An operation for controlling the refresh cycle of the external memory 310 is performed by the memory controller 300 of the SOC 400. The operation of the memory controller 300 has already been explained and will not be explained in detail hereinafter. In addition, as the operations of the SOC 400 and the memory 310 have already been explained, for example, with reference to FIG. 1, they will not be explained hereinafter.

Because the SOC 400 or the semiconductor system can control the refresh cycle of the external memory 310 according to temperature variations, the operating performance of the semiconductor system including the SOC 400 or the external memory 310 can be improved. In addition, because the memory controller 300 and the refresh cycle control method 100 can control the refresh cycle of the external memory 310 according to the operating temperature of the external memory 310, data is retained in the external memory 310.

Further, as the refresh cycle is suitably set for an external temperature or the operating condition and temperature of the external memory 310, efficient access to the external memory 310 can be achieved and its operating performance can be enhanced. Moreover, because the memory controller 300 is applicable to the SOC 400 or the semiconductor system, the performance of the SOC 400 or the semiconductor system can also be improved.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of controlling a refresh cycle of a memory disposed on a system-on-a-chip comprising a memory controller, the method comprising:
   generating a temperature measure command;
   measuring an operating temperature of the memory in response to the temperature measure command;
   receiving the measured temperature measured in response to the temperature measure command;
   setting a reference temperature by a user based on a maximum operating temperature of the memory;
   storing the reference temperature in the memory controller;
   detecting a temperature difference between the measured temperature and the reference temperature;
   increasing the refresh cycle if the measured temperature is below the reference temperature and decreasing the refresh cycle if the measured temperature is above the reference temperature;
   applying a refresh command to the memory in response to a refresh cycle, wherein after the refresh command is applied to the memory:
   generating a new temperature measure command and measuring the operating temperature of the memory;
   receiving a new measured temperature measured in response to the new temperature measure command;
   detecting a temperature difference between the new reference temperature and the new measured temperature;
   repeating the step of changing the refresh cycle; and
   repeating the step of applying a refresh command to the memory.

2. The method of claim 1, wherein the temperature measure command is generated at predetermined intervals.

3. The method of claim 2, wherein the predetermined intervals at which the temperature measure command is generated are set by the user.

4. The method of claim 1, wherein the temperature measure command is applied to the memory when the memory is determined to be in a stand-by mode.

5. The method of claim 1, further comprising:
   determining whether the memory is in an operating condition suitable to receive the refresh command; and
   generating the changed refresh cycle if it is determined that the memory is in the operating condition suitable to receive the refresh command.

6. A memory controller comprising:
   a temperature measure command generating portion that generates a temperature measure command in response to a signal to measure an operating temperature of an external memory;
   a control portion that receives a measured temperature of the external memory and a reference temperature information signal that comprises a reference temperature that is set by a user based on a maximum temperature of the external memory, detects a temperature difference between the measured temperature and the reference temperature, generates a refresh cycle control signal to increase the refresh cycle if the measured temperature is lower than the reference temperature and to decrease the refresh cycle if the measured temperature is higher than the reference temperature and to thereby change a refresh cycle according to the refresh cycle control signal, wherein after a refresh command is applied to the external memory and a new operating temperature of the external memory is measured, the control portion receives the new measured temperature; and detects a temperature difference between the reference temperature and the new measured temperature; and
   a refresh command generating portion that applies a the refresh command to the external memory in response to the refresh cycle control signal.

7. The memory controller of claim 6, further comprising:
   a timer which generates the signal when a value for generating the signal is counted.

8. The memory controller of claim 7, wherein the value is controlled by the user.

9. The memory controller of claim 6, wherein the temperature measure command is applied to the external memory when the external memory is in a stand-by mode.

10. The memory controller of claim 6, further comprising:
    an operating condition determining portion that receives the refresh cycle control signal and determines whether a current operating condition of the external memory is suitable to receive the refresh command, and applies the refresh cycle control signal to the refresh command generating portion if it is determined that the current operating condition of the memory is suitable to receive the refresh command.

11. The memory controller of claim 10, wherein the current operating condition suitable to generate the refresh command is a state where operations for controlling the external memory except a refresh control are halted.

12. A system-on-a-chip comprising:
a timer that generates a periodic signal when a value for generating the periodic signal is counted;
a temperature measure command generating portion that generates a temperature measure command in response to a the periodic signal, whereby an operating temperature of an external memory is measured;
a control portion that receives a measured temperature signal and a reference temperature information signal that comprises a reference temperature that is set by a user based on a maximum temperature of the external memory, detects a temperature difference between the measured temperature and the reference temperature, and generates a refresh cycle control signal to increase the refresh cycle if the measured temperature is different from lower than the reference temperature and to decrease the refresh cycle if the measured temperature is higher than the reference temperature, wherein after a refresh command is applied to the external memory and a new operating temperature of the external memory is measured, the control portion receives the new measured temperature; and detects a temperature difference between the reference temperature and the new measured temperature;
an operating condition determining portion that receives the refresh cycle control signal and determines whether a current operating condition of the external memory is suitable to receive the refresh command, and outputs the refresh cycle control signal if it is determined that the current operating condition is suitable to receive the refresh command; and
a refresh command generating portion that applies a the refresh command to the external memory in response to the refresh cycle control signal from the operating condition determining portion.

* * * * *